(12) United States Patent
Yoda

(10) Patent No.: US 10,396,226 B2
(45) Date of Patent: Aug. 27, 2019

(54) MASTERBATCH FOR SOLAR BATTERY SEALING SHEET AND PROCESS FOR PRODUCING SOLAR BATTERY SEALING SHEET

(71) Applicant: SUMITOMO CHEMICAL COMPANY, LIMITED, Tokyo (JP)

(72) Inventor: Hiroaki Yoda, Ichihara (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/687,073

(22) Filed: Aug. 25, 2017

(65) Prior Publication Data

US 2018/0062014 A1    Mar. 1, 2018

(30) Foreign Application Priority Data

Aug. 29, 2016  (JP) .................................. 2016-166567

(51) Int. Cl.
  *H01L 31/04* (2014.01)
  *C08L 23/06* (2006.01)
  *C08L 23/08* (2006.01)
  *H01L 31/048* (2014.01)

(52) U.S. Cl.
  CPC .......... *H01L 31/0481* (2013.01); *C08L 23/06* (2013.01); *C08L 23/0853* (2013.01); *C08L 2203/162* (2013.01); *C08L 2205/02* (2013.01); *C08L 2205/025* (2013.01); *C08L 2310/00* (2013.01)

(58) Field of Classification Search
  CPC .. H01L 31/0481; C08L 23/06; C08L 23/0853; C08L 2203/162; C08L 2206/02; C08L 2206/025; C08L 2310/00

USPC .......................................................... 524/524
See application file for complete search history.

(56) References Cited

U.S. PATENT DOCUMENTS

| | | | |
|---|---|---|---|
| 9,608,152 B2 * | 3/2017 | Yoda .................... | H01L 31/0481 |
| 2008/0078554 A1 | 4/2008 | Patel et al. | |
| 2014/0360579 A1 * | 12/2014 | Yoda .................... | H01L 31/0481 |
| | | | 136/259 |
| 2015/0129018 A1 * | 5/2015 | Declerck ........... | B32B 17/10018 |
| | | | 136/251 |
| 2016/0217883 A1 * | 7/2016 | Luo ............................ | C08J 3/28 |

FOREIGN PATENT DOCUMENTS

| | | |
|---|---|---|
| JP | H04-296330 A | 10/1992 |
| JP | 2010-504647 A | 2/2010 |
| JP | 2015-135937 A | 7/2015 |
| WO | 2008/036708 A | 3/2008 |

OTHER PUBLICATIONS

Solar Cell Encapsulant Sheet, Technical Disclosure No. 2014-502364, Registration No. 10252670, registered Aug. 6, 2014 (with translation).

* cited by examiner

*Primary Examiner* — Michael Bernshteyn
(74) *Attorney, Agent, or Firm* — Fitch, Even, Tabin & Flannery, LLP

(57) ABSTRACT

A masterbatch for a solar battery sealing sheet containing: at least one ethylene resin selected from the group consisting of an ethylene-α-olefin copolymer, an ethylene homopolymer and an ethylene-unsaturated ester copolymer; and at least one compound selected from the group consisting of silicon dioxide and zeolite, wherein a degree of aggregation of silicon is 0 or more and 0.350 or less and the ignition loss of the compound is more than 1.7% to 15% or less.

10 Claims, No Drawings

US 10,396,226 B2

MASTERBATCH FOR SOLAR BATTERY SEALING SHEET AND PROCESS FOR PRODUCING SOLAR BATTERY SEALING SHEET

TECHNICAL FIELD

This application claims priority from Japanese Patent Application No. 2016-166567 filed in Japan on Aug. 29, 2016, which is hereby incorporated herein by reference in its entirety for all purposes.

The present invention relates to a masterbatch for solar battery sealing sheet and a process for producing a solar battery sealing sheet.

BACKGROUND ART

A solar battery module is attracting attention as one suitable for utilization of renewable energy and its widespread use is progressing.

In general, a solar battery module contains a light-receiving-surface protective material made of glass, a solar battery device, a sealing sheet and a back sheet, and has a structure in which solar battery device is laminated via the sealing sheet between the light receiving surface protective material made of glass and the back sheet. As the sealing sheet, a sheet made of an ethylene-vinyl acetate copolymer or an ethylene-α-olefin copolymer is used. For functional stabilization of a solar battery module, an improvement in the insulation property of a sealing sheet is recently required, and for example, Patent document 1 discloses a solar battery sealing material containing an ethylene copolymer having specific melt flow rate, specific density and specific shore A hardness.

PRIOR ART DOCUMENT

Patent Document

[Patent document 1] Japanese Patent Application National Publication No. 2010-504647

SUMMARY OF THE INVENTION

Problem to be Solved by the Invention

In a mega solar power plant and the like, a further improvement in the insulation property of a sealing sheet is required, because a solar battery module is used under high voltage.

The present invention is made in view of the above-described problem, and its object is to provide a masterbatch for producing a solar battery sealing sheet having a high electrical insulation property.

Means for Solving the Problem

The present inventors have intensively studied for solving the above-described problem and resultantly completed the present invention.

The present invention provided the following [1] to [7].
[1] A masterbatch for a solar battery sealing sheet comprising:
at least one ethylene resin selected from the group consisting of an ethylene-α-olefin copolymer, an ethylene homopolymer and an ethylene-unsaturated ester copolymer and
at least one compound selected from the group consisting of silicon dioxide and zeolite,
wherein a degree of aggregation of silicon is 0 or more and 0.350 or less and
the ignition loss of the compound is more than 1.7% to 15% or less.
[2] The masterbatch for the solar battery sealing sheet according to [1], wherein the ignition loss of the compound is 2% or more and 15% or less.
[3] The masterbatch for the solar battery sealing sheet according to [1] or [2], wherein the ethylene resin is an ethylene-unsaturated ester copolymer.
[4] The masterbatch for the solar battery sealing sheet according to [3], wherein the ethylene-unsaturated ester copolymer is at least one copolymer selected from the group consisting of an ethylene-vinyl acetate copolymer, an ethylene-methyl acrylate copolymer, an ethylene-methyl methacrylate copolymer and an ethylene-vinyl acetate-methyl methacrylate copolymer.
[5] The masterbatch for the solar battery sealing sheet according to [3] or [4], wherein the ethylene-unsaturated ester copolymer is an ethylene-unsaturated ester copolymer containing a monomer unit derived from an unsaturated ester in an amount of 23% by mass or more and 35% by mass or less, with respect to a total amount of a monomer unit derived ethylene and a monomer unit derived from the unsaturated ester of 100% by mass.
[6] The masterbatch for the solar battery sealing sheet produced by melt-kneading a mixture of the masterbatch according to any one of [1] to [5] and at least one ethylene resin selected from the group consisting an ethylene-α-olefin copolymer, an ethylene homopolymer and an ethylene-unsaturated ester copolymer to obtain a melt-kneaded mixture, followed by molding the melt-kneaded mixture into a sheet.
[7] A process for producing a solar battery sealing sheet, comprising melt-kneading a mixture of the masterbatch according to any one of [1] to [5] and at least one ethylene resin selected from the group consisting an ethylene-α-olefin copolymer, an ethylene homopolymer and an ethylene-unsaturated ester copolymer to obtain a melt-kneaded mixture, followed by molding the melt-kneaded mixture into a sheet.

Effect of the Invention

According to the present invention, a masterbatch for producing a solar battery sealing sheet having a high electrical insulation property can be provided.

MODES FOR CARRYING OUT THE INVENTION

In the present specification, "monomer unit" means a constitutional unit of a polymer compound.
[Ethylene Resin]
The ethylene resin contained in the masterbatch for solar battery sealing sheet of the present invention is at least one ethylene resin selected from the group consisting of an ethylene-α-olefin copolymer, an ethylene homopolymer and an ethylene-unsaturated ester copolymer.
[Ethylene-α-Olefin Copolymer]
"Ethylene-α-olefin copolymer" means a copolymer containing a monomer unit derived from ethylene and a monomer unit derived from an α-olefin having a number of carbon atoms of 3 or more and 20 or less. Examples of the α-olefin include propylene, 1-butene, 1-pentene, 1-hexene, 1-heptene, 1-octene, 1-nonene, 1-decene, 1-dodecene, 4-methyl-1-pentene and 4-methyl-1-hexene. In the ethylene-α-olefin copolymer, these α-olefins may be contained singly, or two or more α-olefins may be contained. The α-olefin is preferably 1-butene, 1-hexene, 4-methyl-1-pentene or 1-octene.

The content of the monomer unit derived from ethylene in the ethylene-α-olefin copolymer is preferably 50% by mass or more and 99.5% by mass or less and the content of the monomer unit derived from an α-olefin in the ethylene-α-olefin copolymer is preferably 0.5% by mass or more and 50% by mass or less, because the aggregation of silicon dioxide or zeolite in the sealing sheet using a masterbatch can be more reduced. In this situation, the total amount of the monomer unit derived from ethylene and the monomer unit derived from an α-olefin is 100% by mass. When the ethylene-α-olefin copolymer contains two or more kinds of monomer units derived from α-olefins, the content of the monomer unit derived from an α-olefin is the total amount of monomer units derived from respective α-olefins in the ethylene-α-olefin copolymer.

The total amount of the monomer unit derived from ethylene and the monomer unit derived from an α-olefin having a number of carbon atoms of 3 or more and 20 or less is preferably 95% by mass or more, more preferably 98% by mass or more, still more preferably 100% by mass, with respect to the total mass of the ethylene-α-olefin copolymer of 100% by mass.

The content of the monomer unit derived from ethylene and the content of the monomer unit derived from an α-olefin can be measured by infrared spectroscopy.

Examples of the ethylene-α-olefin copolymer include an ethylene-1-butene copolymer, an ethylene-1-hexene copolymer, an ethylene-4-methyl-1-pentene copolymer, an ethylene-1-octene copolymer, an ethylene-1-butene-1-hexene copolymer, an ethylene-1-butene-4-methyl-1-pentene copolymer, an ethylene-1-butene-1-octene copolymer and an ethylene-1-hexene-1-octene copolymer, and preferable is an ethylene-1-butene copolymer, an ethylene-1-hexene copolymer, an ethylene-4-methyl-1-pentene copolymer, an ethylene-1-butene-1-hexene copolymer, an ethylene-1-butene-1-octene copolymer and an ethylene-1-hexene-1-octene copolymer. In the masterbatch of the present invention, these ethylene-α-olefin copolymers may be contained singly, or two or more ethylene-α-olefin copolymers may be contained.

The upper limit of the density of the ethylene-α-olefin copolymer is preferably 950 kg/m$^3$, more preferably 920 kg/m$^3$, still more preferably 910 kg/m$^3$, especially preferably 905 kg/m$^3$, because the aggregation of silicon dioxide or zeolite in the sealing sheet using a masterbatch can be more reduced. The lower limit of the density of the ethylene-α-olefin copolymer is preferably 860 kg/m$^3$, more preferably 880 kg/m$^3$, still more preferably 900 kg/m$^3$, because a fusion of the masterbatch mutually can be prevented in preserving the masterbatch. The density is measured according to method A defined in JIS K7112-1980 after performing annealing described in JIS K6760-1995. The density of the ethylene-α-olefin copolymer can be controlled by the content of the monomer unit derived from ethylene in the ethylene-α-olefin copolymer.

The lower limit of the melt flow rate (hereinafter, described as "MFR" in some cases.) of the ethylene-α-olefin copolymer is preferably 1 g/10 min, more preferably 3 g/10 min. The upper limit of MFR is preferably 20 g/10 min, more preferably 10 g/10 min. MFR is a value measured by method A defined in JIS K7210-1995 under conditions of a temperature of 190° C. and a load of 21.18 N. MFR of the ethylene-α-olefin copolymer can be adjusted, for example, by controlling the hydrogen concentration or the polymerization temperature in polymerization of the ethylene-α-olefin copolymer. When the hydrogen concentration and the polymerization temperature are increased, MFR of the ethylene-α-olefin copolymer increases.

[Ethylene Homopolymer]

"Ethylene homopolymer" means a polymer consisting of a monomer unit derived from ethylene. The ethylene homopolymer is preferably an ethylene homopolymer obtained by polymerizing ethylene by a high pressure method. Examples thereof include an ethylene homopolymer produced by polymerizing ethylene under conditions of a polymerization pressure of 140 MPa or more and 300 MPa or less, a polymerization temperature of 200° C. or more and 300° C. or less using a tank-type reactor or a tube-type reactor.

The lower limit of the density of the ethylene homopolymer is preferably 920 kg/m$^3$, more preferably 925 kg/m$^3$, still more preferably 928 kg/m$^3$, and the upper limit of the density of the ethylene homopolymer is preferably 935 kg/m$^3$, more preferably 933 kg/m$^3$, because the aggregation of silicon dioxide or zeolite in the sealing sheet using a masterbatch can be more reduced. The density is measured according to method A defined in JIS K7112-1980 after performing annealing described in JIS K6760-1995.

[Ethylene-Unsaturated Ester Copolymer]

"Ethylene-unsaturated ester copolymer" means a copolymer containing a monomer unit derived from ethylene and a monomer unit derived from an unsaturated ester.

The unsaturated ester is a compound having carbon-carbon double bond and an ester bond in the molecule. Examples of the unsaturated ester include vinyl carboxylates, alkyl unsaturated carboxylates and glycidyl unsaturated carboxylates. Examples of the vinyl carboxylate include vinyl acetate and vinyl propionate. Examples of the alkyl unsaturated carboxylate includes methyl acrylate, ethyl acrylate, butyl acrylate, methyl methacrylate and ethyl methacrylate. Examples of the glycidyl unsaturated carboxylate include glycidyl methacrylate and glycidyl acrylate. In the ethylene-unsaturated ester copolymer, the monomer unit derived from unsaturated ester may be contained singly, or two or more monomer units derived from unsaturated ester may be contained.

The ethylene-unsaturated ester copolymer is a polymer obtained by copolymerizing ethylene and an unsaturated ester. Examples of the ethylene-unsaturated ester copolymer include an ethylene-vinyl acetate copolymer, an ethylene-vinyl propionate copolymer, an ethylene-methyl acrylate copolymer, an ethylene-ethyl acrylate copolymer, an ethylene-butyl acrylate copolymer, an ethylene-methyl methacrylate copolymer, an ethylene-ethyl methacrylate copolymer, an ethylene-glycidyl methacrylate copolymer and an ethylene-vinyl acetate-methyl methacrylate copolymer. In the masterbatch of the present invention, the ethylene-unsaturated ester copolymer may be contained singly, or two or more ethylene-unsaturated ester copolymers may be contained.

It is preferable that the ethylene-unsaturated ester copolymer is an ethylene-unsaturated ester copolymer containing a monomer unit derived from an unsaturated ester in an amount of 23% by mass or more and 35% by mass or less and a monomer unit derived from ethylene in an amount of 65% by mass or more and 77% by mass or less, with respect to a total amount of the monomer unit derived from ethylene and the monomer unit derived from an unsaturated ester of 100% by mass, because the aggregation of silicon dioxide or zeolite in the sealing sheet using a masterbatch can be more reduced. The content of a monomer unit derived from ethylene contained in the ethylene-unsaturated ester copolymer is more preferably 67% by mass or more and 75% by mass or less, still more preferably 68% by mass or more and 75% by mass or less, with respect to a total amount of the monomer unit derived from ethylene and the monomer unit derived from an unsaturated ester of 100% by mass.

The content of a monomer unit derived from an unsaturated ester contained in the ethylene-unsaturated ester copolymer is more preferably 25% by mass or more and 33% by mass or less, still more preferably 25% by mass or more and 32% by mass or less, with respect to a total amount of the monomer unit derived from ethylene and the monomer unit derived from an unsaturated ester of 100% by mass.

When the ethylene-unsaturated ester copolymer contains two or more monomer units derived from unsaturated esters, the content of the monomer unit derived from an unsaturated ester is the total amount of monomer units derived from respective unsaturated esters in the ethylene-unsaturated ester copolymer.

The total amount of a monomer unit derived from ethylene and a monomer unit derived from an unsaturated ester is preferably 95% by mass or more, more preferably 98% by mass or more, still more preferably 100% by mass, with respect to the total mass of the ethylene-unsaturated ester copolymer of 100% by mass.

The content of the monomer unit derived from ethylene and the content of the monomer unit derived from an unsaturated ester can be measured by infrared spectroscopy.

The upper limit of the melt flow rate (MFR) of the ethylene-unsaturated ester copolymer is preferably 20 g/10 min, more preferably 10 g/10 min. The lower limit of MFR is preferably 1 g/10 min, more preferably 3 g/10 min. MFR is a value measured by method A defined in JIS K7210-1995 under conditions of a temperature of 190° C. and a load of 21.18 N. MFR of the ethylene-unsaturated ester copolymer can be controlled, for example, by changing the reaction pressure or the reaction temperature in polymerization of the ethylene-unsaturated ester copolymer.

The lower limited of the molecular weight distribution (Mw/Mn) of the ethylene-unsaturated ester copolymer is preferably 2, more preferably 2.5, still more preferably 3, because the extrusion pressure in processing into a solar battery sealing sheet can be more reduced. The upper limit of the molecular weight distribution (Mw/Mn) is preferably 8, more preferably 5, still more preferably 4.5, especially preferably 4, because the strength of a sealing sheet can be more enhance. Mw denotes the polystyrene-equivalent weight-average molecular weight and Mn denotes the polystyrene-equivalent number-average molecular weight.

The polyethylene-equivalent weight-average molecular weight of the ethylene-unsaturated ester copolymer is preferably 40,000 or more and 80,000 or less, more preferably 50,000 or more and 70,000 or less, because the processability of a solar battery sealing sheet can be more enhance. The polyethylene-equivalent weight-average molecular weight is the product of the polystyrene-equivalent weight-average molecular weight and the ratio (17.7/41.3) of Q factor of polyethylene to that of polystyrene, and the polystyrene-equivalent weight-average molecular weight of the ethylene-unsaturated ester copolymer is measured by gel permeation chromatography.

The process for producing the ethylene-unsaturated ester copolymer includes a process for copolymerizing an ethylene and an unsaturated ester in the presence of a known radical generator.

[At Least One Compound Selected from the Group Consisting of Silicon Dioxide and Zeolite]

The masterbatch for solar battery sealing sheet of the present invention contains silicon dioxide, zeolite or both.

In the present specification, the silicon dioxide denotes a compound represented by the general formula: $SiO_2$. Examples of the silicon dioxide include crystalline silicon dioxide and amorphous silicon dioxide. Examples of the amorphous silicon dioxide include calcined amorphous silicon dioxide and non-calcined amorphous silicon dioxide.

Examples of the crystalline silicon dioxide include CRYSTALITE manufactured by Tatsumori Ltd. Examples of the calcined amorphous silicon dioxide include as calcined silica Carplex® CS-5 manufactured by Evonik Degussa Japan Co., Ltd. Examples of the non-calcined amorphous silicon dioxide include VK-SP30S manufactured by China Muyoshiro Shirou New material, porous silica manufactured by Suzuki Yushi Industrial Co., Ltd., Gasil® AB905 manufactured by PQ Corporation, Snow Mark SP-5 manufactured by MARUKAMA Ltd., and, as silica Carplex® #80, Carplex® FPS-2, Carplex® FPS-101, Carplex® #67 manufactured by Evonik Degussa Japan Co., Ltd. The calcined amorphous silicon dioxide usually has an ignition loss described later of less than 2%.

The silicon dioxide is preferably amorphous silicon dioxide, more preferably non-calcined amorphous silicon dioxide, because the transparency and the insulation property of a solar battery sealing sheet can be more enhanced.

In the present specification, the zeolite denotes a substance having the general formula: $M_{2/n}O \cdot Al_2O_3 \cdot xSiO_2 \cdot yH_2O$, wherein M represents Na, K, Ca or Ba, n represents valence of M, x represents a number from 2 to 10, and y represents a positive number from 2 to 7, and having a structure in which an alkali metal, an alkaline earth metal or water is contained in a vacancy in a three-dimensional network structure formed by sharing of vertexes of $(Al,Si)O_4$ tetrahydron. In the present invention, any of natural zeolite and synthetic zeolite may be used. Examples of the natural zeolite include analcime, chabazite, erionite, natrolite, mordenite, clinoptilolite, heulandite, stilbite and laumontite. Examples of the synthetic zeolite include A type zeolite, X type zeolite, Y type zeolite, L type zeolite and ZSM-5. The synthetic zeolite can be obtained by thoroughly mixing starting materials such as sodium silicate, sodium aluminate, silica gel, precipitating a crystal at 80 to 120° C., washing the resultant crystal until pH of a filtrate become pH9 to 12, then, filtrating the crystal.

Examples of the zeolite include 820NHA, 822HOA, 643NHA and 842HOA belonging to Hi-Silica zeolite HSZ® series manufactured by Tosoh Corporation, and Molecular Sieve 3A and Molecular Sieve 4A manufactured by Union Showa K.K.

The ignition loss of at least one compound selected from the group consisting of silicon dioxide and zeolite is preferably more than 1.7%, more preferably 2% or more, still more preferably 3% or more and especially preferably 4% or more, because the PID phenomenon of a solar battery can be more suppressed. The ignition loss of the compound is preferably usually 15% or less, more preferably, 13% or less and still more preferably 10% or less. The ignition loss of the compound is preferably more than 1.7% and 15% or less, more preferably 2% or more and 13% or less, and still more preferably 3% or more and 10% or less. The ignition loss is a value measured according to a method defined in JIS K1150-1994 using a sample dried in vacuum at about 150° C. The measured value shows the amount of a volatile substance in the compound.

The average particle size of the compound is preferably 0.001 μm or more and 30 μm or less, more preferably 0.01 μm or more and 10 μm or less, because the compound can be dispersed more uniformly in a solar battery sealing sheet. In the present specification, the particle size denotes a diameter of the particle.

In the present specification, the average particle size of the compound denotes median diameter calculated by the following method. A dispersion liquid prepared by dispersing the compound in ethanol was irradiated with a laser beam, to obtain a diffraction pattern formed on the focal plane by collecting the scattering light generated with a lens. The particle size distribution on volume basis of the compound is measured based on the resultant diffraction pattern. The median diameter (50% diameter) in the volume-based cumulative fraction in the particle size distribution measured on volume base from diffraction image is determined.

The process for adjusting the average particle size of the compound to 0.001 μm or more and 30 μm or less includes, for example, a process for crushing the compound in a mortar or a process for grinding by a jet mill.

[Degree of Aggregation of Silicon]

The degree of aggregation of silicon is the index of aggregability in a resin of a compound having silicon, obtained by mapping the intensity of characteristic X-ray derived from silicon using an electron probe microanalyzer and an image analysis method. The degree of aggregation of silicon is calculated by the following method using an electron probe microanalyzer. First, a masterbatch is press-molded at 110° C., to obtain a sheet having a thickness of about 500 μm. The sheet is faced by a cryomicrotome at −80° C., to prepare one sample of which the cross-sectional surface along the thickness direction of the sheet is observation plane. The sample is attached to a sample stage for cross-sectional observation with a carbon tape. Then, for conductive treatment, a carbon paste is applied to the lateral side of sample, as non-observation plane and then the sample cross-sectional surface as observation plane and the lateral side of the sample as non-observation plane are coated with electron conductive material (Au). The characteristic X-ray intensity map of the sample is obtained by using the electron probe microanalyzer (manufactured by Shimadzu Corp., EPMA-1610) at a measurement pitch of 1 μm (image size: 500-500) and an accelerating voltage of 15 kV in a measurement range of 500 μm×500 μm. In this procedure, X-ray spectroscopic conditions are a wavelength of PET/7.126 Å Si-Kα and an exposure time of 10 ms/point. Two characteristic X-ray intensity mapping images with the same size are obtained in each sample. Each intensity mapping image of silicon is gray-scaled using image processing software (Adobe Photoshop®, manufactured by Adobe Systems Incorporated). Using an image analysis software (NanoHunter NS2K-Pro, manufactured by Nanosystem Corporation), the image thresholding is carried out. The image is replaced with the white part when the image intensity is 9 or more and 27 or less and the image is replaced with the black part when the intensity is less than 9. In each image after the image thresholding, the white part is defined as a part derived from particles of at least one compound selected from the group consisting of silicon dioxide and zeolite. In each image after the image thresholding, the area-based particle size distribution of an aggregate of the compound is measured. Each value of the degree of aggregation of silicon is determined according to the following formula, and the average value of these values is defined as the degree of aggregation of silicon.

Degree of aggregation of silicon=(the number of aggregates having an area of over 20 μm² per one aggregate of the compound)/(the number of aggregates having an area of over 5 μm² per one aggregate of the compound)

The degree of aggregation of silicon is 0 or more and 0.350 or less, still more preferably 0.05 or more and 0.345 or less, from the volume resistivity of the resultant solar battery sealing sheet can be more enhance.

The degree of aggregation of silicon in a masterbatch can be adjusted by controlling the content of at least one compound selected from the group consisting of silicon dioxide and zeolite in the masterbatch, MFR of an ethylene resin containing in the masterbatch, or the kneading temperature in producing the masterbatch.

For adjusting the degree of aggregation of silicon in a masterbatch to 0.350 or less, it is preferable that the content of at least one compound selected from the group consisting of silicon dioxide and zeolite in the masterbatch is 4% by mass or more and 40% by mass or less, it is more preferable that the upper limit is 30% by mass or less, with respect to the total mass of the masterbatch of 100% by mass.

For adjusting the degree of aggregation of silicon in a masterbatch to 0.350 or less, it is preferable that MFR of the ethylene resin contained in the masterbatch is 1 g/10 min or more and 20 g/10 min or less, more preferably 3 g/10 min or more and 10 g/10 min or less.

For adjusting the degree of aggregation of silicon in a masterbatch to 0.350 or less, the kneading temperature in producing the masterbatch is preferably 70° C. or more and 180° C. or less, more preferably 75° C. or more and 160° C. or less, when the main component of the ethylene resin contained in the masterbatch is an ethylene-unsaturated ester copolymer. The kneading temperature in producing a masterbatch is preferably 130° C. or more and 180° C. or less, more preferably 140° C. or more and 160° C. or less, when the main component of the ethylene resin contained in the masterbatch is an ethylene-α-olefin copolymer or an ethylene homopolymer.

[Masterbatch for Solar Battery Sealing Sheet]

The masterbatch of the present invention is obtained by kneading an additive of high concentration into a plastic and the resultant masterbatch is used for diluting the additive at prescribed magnification in molding a plastic. The masterbatch for solar battery sealing sheet of the present invention is used for mixing with an ethylene resin as the main component constituting a solar battery sealing sheet, thereby allowing the solar battery sealing sheet to contain prescribed amount of at least one compound selected from the group consisting of silicon dioxide and zeolite, in producing the solar battery sealing sheet. The ethylene resin as the main component constituting a solar battery sealing sheet contains at least one compound selected from the group consisting of silicon dioxide and zeolite.

The content of the compound contained in a masterbatch is larger than that of the compound contained in a solar battery sealing sheet produced by using the masterbatch. It is preferable to produce a solar battery sealing sheet by mixing 0.05 to 40 parts by mass of the masterbatch for solar battery sealing sheet with respect to 100 parts by mass of the ethylene resin as the main component constituting a solar battery sealing sheet, and the compounding amount of the masterbatch for solar battery sealing sheet is more preferably in the range of 0.1 to 10 parts by mass. The lower limit of the content of at least one compound selected from the group consisting of silicon dioxide and zeolite is preferably 4% by mass and the upper limit of the content is preferably 40% by mass, more preferably 30% by mass, in the masterbatch for solar battery sealing sheet, with respect to the total mass of the masterbatch of 100% by mass.

The content of at least one compound selected from the group consisting of silicon dioxide and zeolite in a masterbatch and the amount of the masterbatch to be used for the solar battery sealing sheet are controlled, so as to corresponding to the preferable content of the compound in a solar battery sealing sheet.

The masterbatch for solar battery sealing sheet of the present invention can be produced by blending components to be contained in the masterbatch, or blending the components and additives, then, kneading them using a twin screw kneading machine or a Banbury kneading machine. The temperature in kneading is preferably 70° C. or more and 180° C. or less, more preferably 75° C. or more and 160° C. or less, when the main component of the ethylene resin contained in the masterbatch is an ethylene-unsaturated ester copolymer. The temperature in kneading is preferably 130° C. or more and 180° C. or less, more preferably, 140° C. or more and 160° C. or less, when the main component of the ethylene resin contained in the masterbatch is an ethylene-α-olefin copolymer or an ethylene homopolymer.

The masterbatch can also be pelletized using an extruder after kneading. In this case, the set temperature of the extruder is usually 70 to 190° C., preferably 80 to 160° C. when the main component of the ethylene resin contained in the masterbatch is an ethylene-unsaturated ester copolymer. The set temperature of the extruder is preferably 130° C. or more and 180° C. or less, more preferably 140° C. or more and 160° C. or less when the main component of the ethylene resin contained in the masterbatch is an ethylene-α-olefin copolymer or an ethylene homopolymer.

[Solar Battery Sealing Sheet]

The solar battery sealing sheet is one of members of a solar battery, and is a sheet used for mutual adhesion of glass and solar battery cell, and mutual adhesion of solar battery cells and back sheets. At least one ethylene resin selected from the group consisting of an ethylene-α-olefin copolymer, an ethylene homopolymer and an ethylene-unsaturated ester copolymer is contained in an amount of preferably 90% by mass or more, still more preferably 95% by mass or more, with respect to the total mass of the solar battery sealing sheet of 100% by mass. Preferable ethylene resin used for the solar cell sealing sheet is the same as the preferable one used for the masterbatch.

The content of at least one compound selected from the group consisting of silicon dioxide and zeolite in a solar battery sealing sheet is preferably 0.001 part by mass or more and 5 parts by mass or less, and the lower limit of the content is preferably 0.01 part by mass, more preferably 0.1 part by mass and the upper limit of the content is preferably 5 parts by mass, more preferably 0.5 parts by mass, when the total amount of the ethylene resin contained in the masterbatch and the ethylene resin to be mixed with the masterbatch is 100 parts by mass.

The masterbatch for solar battery sealing sheet of the present invention and the solar battery sealing sheet obtained by using the masterbatch may contain a crosslinking agent. The crosslinking agent includes those generating a radical at a temperature over the melting point of the ethylene resin contained in a sealing sheet, and preferable are organic peroxides having the 1 hour half-life temperature higher than the melting point of the ethylene resin contained in a sealing sheet. Organic peroxides having a 1 hour half-life temperature of 100° C. or more and 150° C. or less are preferable as the crosslinking agent, because they are not easily decomposed in processing into a solar battery sealing sheet, the crosslinking agent is decomposed by heating in fabrication of a solar battery, and mutual crosslinkage of an ethylene resin progresses easily. Organic peroxides having a 1 hour half-life temperature of 70° C. or more are further preferable, and examples thereof include t-butylperoxy-2-ethylhexyl carbonate, 2,5-dimethylhexane-2,5-dihydro peroxide and dialkyl peroxide, because the crosslinking agent is not easily decomposed in processing into a solar battery sealing sheet. In the masterbatch and the sealing sheet, the crosslinking agents may be contained singly, or two or more crosslinking agents may be contained.

The dialkyl peroxide is a compound not having a polar group other than a peroxy group. Examples of the polar group includes —COO—, —CO—, —OH and —NH$_2$. Several peroxy groups may be contained in one molecule.

Examples of the dialkyl peroxide include di(2-t-butylperoxyisopropyl)benzene, dicumyl peroxide, 2,5-dimethyl-2,5-di(t-butylperoxy)hexane, t-butyl cumyl peroxide, di-t-butyl peroxide and 2,5-dimethyl-2,5-di(t-butylperoxy)hexyne-3. In the masterbatch and the sealing sheet, the dialkyl peroxides may be contained each singly, or two or more dialkyl peroxides may be contained. Further, the dialkyl peroxide and a crosslinking agent other than the dialkyl peroxide may be used in combination.

When the masterbatch for solar battery sealing sheet and the sealing sheet of the present invention contain the crosslinking agent, the crosslinking agent remaining without decomposing by heating in fabricating a solar battery is sometimes decomposed gradually in use of the solar battery, to cause deteriorations such as discoloration of a solar battery sealing sheet. The content of the crosslinking agent is preferably 0.001 part by mass or more and 5 parts by mass or less, with respect to 100 parts by mass of the ethylene resin contained in the sealing sheet, because such deterioration of a solar battery sealing sheet by the remaining crosslinking agent can be suppressed. The content of the crosslinking agent is more preferably 0.001 parts by mass or more and 2 parts by mass or less, with respect to 100 parts by mass of the ethylene resin contained in the sealing sheet, because bubbles generating in fabricating a solar battery can be suppressed.

The masterbatch for solar battery sealing sheet and the sealing sheet of the present invention may contain a crosslinking aid. Examples of the crosslinking aid include monofunctional crosslinking aids, bifunctional crosslinking aids, trifunctional crosslinking aids and crosslinking aids having four or more (meth)acryloyl groups. Examples of the monofunctional crosslinking aid include acrylates and methacrylates. Examples of the bifunctional crosslinking aid include N,N'-m-phenylenebismaleimide. Examples of the trifunctional crosslinking aid include triallyl isocyanurate and trimethylolpropane triacrylate. In the masterbatch and the sealing sheet, the crosslinking aid may be contained singly, or two or more crosslinking aids may be contained.

The crosslinking aid having four or more (meth)acryloyl groups has four or more (meth)acryloyl groups in one molecule. Examples thereof include pentaerythritol tetra(meth)acrylate, ditrimethylolpropane tetra(meth)acrylate, dipentaerythritol penta(meth)acrylate, dipentaerythritol hexa(meth)acrylate, tripentaerythritol hepta(meth)acrylate, tripentaerythritol octa(meth)acrylate and pentaerythritol tri(meth)acrylate dimer. Further, acrylic acid adducts or acrylate adducts of them may be permissible, and these may also be modified with ethylene oxide and propylene oxide. Examples thereof include pentaerythritol tetra(meth)acrylate.monoacrylic acid adduct, pentaerythritol tetra(meth) acrylate ethylene oxide-modified product and dipentaerythritol penta(meth)acrylate ethylene oxide-modified product. In the masterbatch and the sealing sheet, these may be contained singly, or two or more of them may be contained. Further, the crosslinking aid having four or more (meth) acryloyl groups and a crosslinking aid other than the crosslinking aid having four or more (meth)acryloyl groups may be used in combination.

In the present specification, the (meth)acryloyl group denotes a methacryloyl group or an acryloyl group, and the (meth)acrylate denotes a methacrylate or an acrylate.

Examples of the crosslinking aid having four or more (meth)acryloyl groups include urethanepoly(meth)acrylate. The urethanepoly(meth)acrylate can be synthesized, for example, from an organic isocyanate and a hydroxyl group-containing (meth)acrylate. The urethanepoly(meth)acrylate of high number-average molecular weight is preferable. Specifically, those having a number-average molecular weight of 1000 or more are preferable, those of 1200 or more are more preferable.

Examples of commercially available products of the crosslinking aid having four or more (meth)acryloyl groups include "A-DPH", "AD-TMP", "U-4HA", "U-6HA", "U-6LPA", "U-15HA", "UA-122P", "UA-33H", "A-9550", "ATM-35E", "A-DPH-6E", "A-DPH-12E", "M-DPH-6E" and "M-DPH-12E" manufactured by Shin-Nakamura Chemical Co., Ltd., "UA-306H", "UA-306T", "UA306I" and "UA510H" manufactured by Kyoeisha Chemical Co., Ltd., "KRM8452", "EB1290", "EB5129", "KRM7864" and "EB1290K" manufactured by DAICEL-ALLNEX Ltd., "Viscoat 802" manufactured by Osaka Organic Chemical Industry Ltd., "UV7600B", "UV7605B", "UV7610B" and "UV7620EA" manufactured by The Nippon Synthetic Chemical Industry Co., Ltd. In the masterbatch and the sealing sheet, these may be contained singly, or two or more of them may be contained.

When solar battery sealing sheet of the present invention contains the crosslinking aid, the content of the crosslinking aid is preferably 10 parts by mass or less, more preferably 0.1 part by mass or more and 5 parts by mass or less, still more preferably 0.5 parts by mass or more and 2.0 parts by mass or less, with respect to 100 parts by mass of the ethylene resin contained in the sealing sheet.

The masterbatch for solar battery sealing sheet and the sealing sheet of the present invention may contain a silane coupling agent, an ultraviolet absorber, an antioxidant, an anticlouding agent, a plasticizer, a surfactant, a coloring agent, an antistatic agent, a discoloration inhibitor, a flame retardant, a crystal nucleating agent, a lubricant and a light stabilizer, according to demands.

Examples of the UV absorber include a benzophenone-based UV absorber, a benzotriazole-based UV absorber, a hindered amine UV absorber, a triazine-based UV absorber, a salicylic acid-based UV absorber, and a cyanoacrylate-based UV absorber. In the masterbatch and the sealing sheet, the UV absorber may be contained singly, or two or more US absorbers may be contained.

Examples of the benzophenone-based UV absorber include 2-hydroxy-4-octoxybenzophenone and 2-hydroxy-4-methoxy 5-sulfobenzophenone.

Examples of the benzotriazole-based UV absorber include 2-(2'-hydroxy-5-methylphenyl)benzotriazole, 2-(2H-1,2,3-benzotriazol-2-yl)-4,6-di-tert-butylphenol; 2-(5-chloro-2H-1,2,3-benzotriazol-2-yl)-4,6-di-tert-butylphenol; 2-(2H-1,2, 3-benzotriazol-2-yl)-4,6-di-tert-pentyl phenol; 2-(5-chloro-2H-1,2,3-benzotriazol-2-yl)-4,6-di-tert-pentylphenol; 2-(2H-1,2,3-benzotriazol-2-yl)-4-tert-butylphenol; 2-(5-chloro-2H-1,2,3-benzotriazol-2-yl)-4-tert-butylphenol; 2-(2H-1,2,3-benzotriazol-2-yl)-4-methylphenol; 2-(5-chloro-2H-1,2,3-benzotriazol-2-yl)-4-methylphenol; 2-(2H-1,2,3-benzotriazol-2-yl)-6-dodecyl-4-methylphenol; 2-(5-chloro-2H-1,2,3-benzotriazol-2-yl)-6-dodecyl-4-methylphenol; 2-(2H-1,2,3-benzotriazol-2-yl)-4-methyl-6-tert-butylphenol; and 2-(5-chloro-2H-1,2,3-benzotriazol-2-yl)-4-methyl-6-tert-butylphenol.

When a benzophenone-based UV absorber and a benzotriazole-based UV absorber are used in combination as a UV absorber, the sum total of the contents of the benzophenone-based UV absorber and the benzotriazole-based UV absorber is preferably not less than 0.01 parts by mass, more preferably not less than 0.1 parts by mass, and is preferably not more than 5 parts by mass, more preferably not more than 1.0 parts by mass, relative to 100 parts by mass of the ethylene resin contained in the sealing sheet.

Examples of the hindered amine UV absorber include phenyl salicylate and p-tert-buthylphenyl salicylate. The content of the hindered amine UV absorber is preferably 0.01 parts by mass to 5 parts by mass relative to 100 parts by mass of the ethylene resin contained in the sealing sheet.

Examples of the triazine-based UV absorbers include 2-(2-hydroxy-4-hydroxymethylphenyl)-4,6-diphenyl-s-triazine, 2-(2-hydroxy-4-hydroxymethylphenyl)-4,6-bis(2,4-dimethylphenyl)-s-triazine, 2-[2-hydroxy-4-(2-hydroxyethyl)phenyl]-4,6-diphenyl-s-triazine, 2-[2-hydroxy-4-(2-hydroxyethyl)phenyl]-4,6-bis(2,4-dimethylphenyl)-s-triazine, 2-[2-hydroxy-4-(2-hydroxyethoxy)phenyl]-4,6-diphenyl-s-triazine, 2-[2-hydroxy-4-(2-hydroxyethoxy)phenyl]-4,6-bis(2,4-dimethylphenyl)-s-triazine, 2-[2-hydroxy-4-(3-hydroxypropyl)phenyl]-4,6-diphenyl-s-triazine, 2-[2-hydroxy-4-(3-hydroxypropyl)phenyl]-4,6-bis(2,4-dimethylphenyl)-s-triazine, 2-[2-hydroxy-4-(3-hydroxypropoxy)phenyl]-4,6-diphenyl-s-triazine, 2-[2-hydroxy-4-(3-hydroxypropoxy)phenyl]-4,6-bis(2,4-dimethylphenyl)-s-triazine, 2-[2-hydroxy-4-(4-hydroxybutyl)phenyl]-4,6-diphenyl-s-triazine, 2-[2-hydroxy-4-(4-hydroxybutyl)phenyl]-4,6-bis(2,4-dimethylphenyl)-s-triazine, 2-[2-hydroxy-4-(4-hydroxybutoxy)phenyl]-4,6-diphenyl-s-triazine, 2-[2-hydroxy-4-(4-hydroxybutoxy)phenyl]-4,6-bis(2,4-dimethylphenyl)-s-triazine, 2-(2-hydroxy-4-hydroxymethylphenyl)-4,6-bis(2-hydroxy-4-methylphenyl)-s-triazine, 2-[2-hydroxy-4-(2-hydroxyethyl)phenyl]-4,6-bis(2-hydroxy-4-methylphenyl)-s-triazine, 2-[2-hydroxy-4-(2-hydroxyethoxy)phenyl]-4,6-bis(2-hydroxy-4-methylphenyl)-s-triazine, 2-[2-hydroxy-4-(3-hydroxypropyl)phenyl]-4,6-bis(2-hydroxy-4-methylphenyl)-s-triazine, 2-[2-hydroxy-4-(3-hydroxypropoxy)phenyl]-4,6-bis(2-hydroxy-4-methylphenyl)-s-triazine, 2-[4,6-bis(2,4-dimethylphenyl)-1,3,5-triazin-2-yl]-5-(octyloxy)phenol, and 2-(4,6-diphenyl-1,3,5-triazin-2-yl)-5-hexyloxy-phenol.

Examples of the salicylic acid-based UV absorber include phenyl salicylate and 4-tert-butylphenyl salicylate.

Examples of the cyanoacrylate-based UV absorber include 2-ethylhexyl-2-cyano-3,3'-diphenyl acrylate and ethyl-2-cyano-3,3'-diphenyl acrylate.

Examples of the antioxidant include an amine-based antioxidant, a phenol-based antioxidant, a phosphorus-containing antioxidant, a bisphenyl antioxidant, and a hindered amine antioxidant, and specifically include di-tert-butyl-p-cresol, aryl phosphites, such as bis(2,2,6.6-tetramethyl-4-piperazyl) sebacate tris(2,4-di-tert-butylphenyl) phosphite, tris(nonylphenyl) phosphite, or triphenyl phosphite, alkyl phosphites, such as trisisodecyl phosphite, trilauryl phosphite, and tris(tridecyl) phosphite, alkylaryl phosphites, such as diphenylisooctyl phosphite, diphenylisodecyl phosphite, diisodecylphenyl phosphite, diisooctyloctylphenyl phosphite, phenylneopentylglycol phosphite, 2,4,6-tri-tert-buthylphenyl(2-butyl-2-ethyl-1,3-propanediol) phosphite, and (2,4,8,10-tetrakis(tert-butyl)-6-{(ethylhexyl)oxy}-12H-dibenzo)[d,g]1,3,2-dioxaphosphocin, octadecyl-3-(3,5-di-tert-butyl-4-hydroxyphenyl) propionate, pentaerythritol-tetrakis[3-(3,5-di-tert-butyl-4-hydroxyphenyl) propionate], 1,3,5-trimethyl-2,4,6-tris(3,5-di-tert-butyl-4-hydroxybenzyl)benzene, thiodiethylene-bis[3-(3,5-di-tert-butyl-4-hydroxyphenyl) propionate], N,N'-hexane-1,6-diylbis[3-(3,5-di-tert-butyl-4-hydroxyphenyl) propionamide], diethyl((3,5-bis(1,1-dimethylethyl)-4-hydroxyphenyl)methyl) phosphate, 3,3',3'',5,5',5''-hexa-tert-butyl-α,α',α''-(mesitylene-2,4,6-triyl)tri-p-cresol, ethylenebis(oxyethylene)bis(3-(5-tert-butyl-4-hydroxy-m-tolyl) propionate), hexamethylenebis(3-(3,5-di-tert-butyl-4-hydroxyphenyl) propionate), 1,3,5-tris(3,5-di-tert-butyl-4-hydroxybenzyl)-1,3,5-triazine-2,4,6(1H,3H,5H)-trione, 1,3,5-tris((4-tert-butyl-3-hydroxy-2,6-xylyl)methyl)-1,3,5-triazine-2,4,6(1H,3H,5H)-trione, 2,6-di-tert-butyl 4-(4,6-bis(octylthio)-1,3,5-triazin-2-ylamino)phenol, and 3,9-bis(2-(3-(3-tert-butyl-4-hydroxy-5-methylphenyl)propionyloxy)-1,1-dimethylethyl)-2,4,8,10-tetraoxaspiro(5.5)undecane.

The content of the antioxidant is preferably not less than 0.02 part by mass to not more than 0.5 parts by mass and more preferably not less than 0.05 parts by mass to not more than 0.3 parts by mass, relative to 100 parts by mass of the ethylene resin contained in the sealing sheet.

Examples of the coloring agent include white coloring agents such as titanium white and calcium carbonate, blue coloring agents such as ultramarine, black coloring agents such as carbon black, and milk white coloring agents such as glass beads and a light-diffusing agent; titanium white is preferable. The content of such a coloring agent is preferably not less than 1 part by mass, and is preferably not more than 10 parts by mass, more preferably not more than 5 parts by mass, with respect to 100 parts by mass of the ethylene resin contained in the sealing sheet.

Examples of the plasticizer include esters of polybasic acids and esters of polyhydric alcohols. Specific examples thereof include dioctyl phthalate, dihexyl adipate, triethylene glycol di-2-ethylbutyrate, butyl sebacate, tetraethylene glycol diheptanoate, and triethylene glycol dipelargonate. The content of the plasticizer is preferably not more than 5 parts by mass relative to 100 parts by mass of the ethylene resin contained in the sealing sheet.

Examples of the discoloration inhibitor include a salt of a higher fatty acid with a metal, such as cadmium and barium. Examples of the salt of a metal with a higher fatty acid include a metallic soap. The content of the discoloration inhibitor is preferably not more than 5 parts by mass relative to 100 parts by mass of the ethylene resin contained in the sealing sheet.

Examples of the flame retardant include an organic flame retardant containing one or more halogen atoms in its molecule and an inorganic flame retardant containing one or more halogen atoms in its molecule. A chlorine atom or a bromine atom is preferable as the halogen atom.

Examples of the organic flame retardant containing one or more halogen atoms in its molecule include tris(2,3-dibromopropyl) isocyanurate or the like and their polymers, chlorinated paraffin, chlorinated polyethylene, hexachloroendomethylenetetrahydrophthalic acid, perchloropentaclodecane, tetrachlorophthalic anhydride, 1,1,2,2-tetrabromoethane, 1,4-dibromobutane, 1,3-dibromobutane, 1,5-dibromopentane, ethyl α-bromobutyrate, and 1,2,5,6,9,10-hexabromocyclodecane.

Examples of the inorganic flame retardant containing one or more halogen atoms in its molecule include hydroxides such as aluminum hydroxide and magnesium hydroxide, phosphates such as ammonium phosphate and zinc phosphate, and red phosphorus.

The content of the flame retardant is preferably not less than 1 part by mass, and is preferably not more than 70 parts by mass, more preferably not more than 50 parts by mass, relative to 100 parts by mass of the ethylene resin contained in the sealing sheet.

The encapsulant sheet according to the present invention may further comprise antimony trioxide or expanded graphite as a flame retardant aid. When expanded graphite is contained as a flame retardant aid, the content of the expanded graphite is preferably not less than 1 part by mass, and is preferably not more than 25 parts by mass, more preferably not more than 17 parts by mass, relative to 100 parts by mass of the ethylene resin contained in the sealing sheet. When antimony trioxide is contained as a flame retardant aid, the content of the antimony trioxide is preferably not less than 2 parts by mass, and is preferably not more than 10 parts by mass, more preferably not more than 9 parts by mass, relative to 100 parts by mass of the ethylene resin contained in the sealing sheet.

Examples of the lubricant include a fatty acid amide compound and a phosphite compound. Specific examples of the fatty acid amide compound include oleamide, erucamide, stearamide, behenamide, ethylenebisoleamide, and ethylene bisstearamide. Examples of the phosphite compound include alkyl phosphites, such as decyl phosphite; alkyl acid phosphates, such as decyl acid phosphate; aryl acid phosphates, such as phenyl acid phosphate; trialkyl phosphates, such as trihexyl phosphate; triaryl phosphates, such as tricresyl phosphate; and zinc dithiophosphate.

The content of the lubricant is preferably not less than 0.05 parts by mass, and is preferably not more than 1 part by mass, more preferably not more than 0.5 parts by mass, relative to 100 parts by mass of the ethylene resin contained in the sealing sheet.

The silane coupling agent to be used for the present invention is added in order to enhance the adhesion of the encapsulant sheet to a light-receiving-surface protective member, a lower protective member (backsheet), and a solar cell element. Examples of the silane coupling agent include γ-chloropropyltrimethoxysilane, vinyltrichlorosilane, vinyltriethoxysilane, vinyl-tris(β-methoxyethoxy)silane, γ-methacryloxypropyltrimethoxysilane, β-(3,4-ethoxycyclohexyl)ethyl-trimethoxysilane, γ-glycidoxypropyltrimethoxysilane, vinyltriacetoxysilane, γ-mercaptopropyltrimethoxysilane, γ-aminopropyltrimethoxysilane, N-β-(aminoethyl)-γ-aminopropyltrimethoxysilane, allyltrimethoxysilane, allyltriethoxysilane, allyltriisopropoxysilane, vinylethyltrimethoxysilane, vinylethyltriethoxysilane, vinylpropyltrimethoxysilane, vinylbutyltrimethoxysilane, vinylbutyltriethoxysilane, vinylbutyltriisopropoxysilane, vinylpentyltrimethoxysilane, vinylhexyltrimethoxysilane, vinylheptyltrimethoxysilane, and vinyloctyltrimethoxysilane. Regarding these silane coupling agents, a single agent may be used, or alternatively two or more agents may be used in combination.

As a silane coupling agent, γ-methacryloxypropyltrimethoxysilane, allyltrimethoxysilane, allyltriethoxysilane, allyltriisopropoxysilane, vinylethyltrimethoxysilane, vinylethyltriethoxysilane, vinylpropyltrimethoxysilane, vinylbutyltrimethoxysilane, vinylbutyltriethoxysilane, or vinylbutyltriisopropoxysilane is preferable, and vinylbutyltrimethoxysilane is more preferable.

The lower limit of the content of the silane coupling agent is preferably 0.001 part by mass, more preferably 0.01 part by mass, still more preferably 0.1 part by mass and the upper limit of the content of the silane coupling agent is preferably 5 parts by mass, more preferably 1.0 part by mass, more preferably 0.5 parts by mass, with respect to 100 parts by mass of the ethylene resin contained in the sealing sheet.

Examples of the light stabilizer used in the present invention include bis(2,2,6,6-tetramethyl-4-piperidyl) sebacate, bis(1-undecanoxy-2,2,2,6-tetramethylpiperidin-4-yl) carbonate and hindered amine-based compounds having a pKa of 6.0 to 8.0 and having a molecular weight of 2,000 to 10,000. Examples of the hindered amine-based compound having a pKa of 6.0 to 8.0 and having a molecular weight of 2,000 to 10,000 include a copolymer composed of 2,2,6,6-tetramethyl-4-piperidineamine and an α-alkane having a number of carbon atoms of 20 to 24 and 4-hydroxy-2,2,6,6-tetramethyl-1-piperidineethanol. The content of the light stabilizer is preferably 0.05 parts by mass or more and 1 part by mass or less, more preferably 0.1 part by mass or more and 0.5 parts by mass or less, still more preferably 0.3 parts by mass or less, with respect to 100 parts by mass of the ethylene resin contained in the sealing sheet.

Commercially available products of the hindered amine-based compound having a pKa of 6.0 to 8.0 and having a molecular weight of 2,000 to 10,000 include Tinuvin® 622, Uvinul® 5050H (all produced by BASF), or the like. In the masterbatch and the sealing sheet, the light stabilizers may be contained singly, or two or more light stabilizers may be contained.

The process for producing a solar battery sealing sheet includes a process for molding a mixture of the masterbatch of the present invention and an ethylene resin as the main component constituting a solar battery sealing sheet into a sheet by a melt extrusion sheet molding method or a roll molding method.

The mixture may contain various additives if necessary. The mixture may also be previously melt-kneaded to give a resin composition before molding into a sheet.

The sheet molding machine used for a melt extrusion sheet molding method includes a T-die extrusion molding machine. The sheet molding machine used for a roll molding method includes a calendar molding machine.

[Solar Battery Module]

A solar battery in which a solar battery device is sealed between a light receiving surface protective material and a lower protective material can be obtained by using the solar battery sealing sheet of the present invention. The light receiving surface protective material includes protective materials having translucency such as glass and plastics. The lower protective material includes various protective materials such as plastics, ceramics, stainless steel and aluminum.

The solar battery is fabricated, for example, as described below. Each one solar battery sealing sheet of the present invention is placed on both surfaces of a tabular solar battery device such as a silicon substrate for solar battery. The light receiving surface protective material is allowed to contact one surface of the solar battery device on which the solar battery sealing sheet has been placed and the lower protective material is allowed to contact the other surface, these are introduced into a vacuum laminator, the inside of the vacuum laminator is evacuated, then, the inside of the vacuum laminator is heated to a temperature at which the solar battery sealing sheet is melted. The solar battery sealing sheet is melted to a certain extent, then, pressed while heating. By heating under vacuum and pressing, an ethylene resin contained in one solar battery sealing sheet is crosslinked mutually, and an ethylene resin contained in the solar battery sealing sheet placed on one surface of the solar battery device and an ethylene resin contained in the solar battery sealing sheet placed on the other surface is crosslinked. By the heating, a silane coupling agent contained in the solar battery sealing sheet and the light receiving surface protective material, and a silane coupling agent contained in the solar battery sealing sheet and the lower protective material, and a silane coupling agent contained in the solar battery sealing sheet and the solar battery device react, respectively, thus, the solar battery sealing sheet and the light receiving surface protective material, and the solar battery sealing sheet and the lower protective material, and the solar battery sealing sheet and the solar battery device are adhered, respectively.

The solar battery device includes P-type monocrystalline silicon, N-type monocrystalline silicon, polycrystalline silicon, amorphous silicon, a compound-based element or the like.

The solar battery sealing sheet obtained by using the masterbatch for solar battery sealing sheet of the present invention is excellent in translucency, can enhance the conversion efficiency of a solar battery, has a high insulation property and can suppress the PID phenomenon.

EXAMPLES

The present invention is described further in detail by examples below.

[Content of Monomer Units Derived from Vinyl Acetate (Unit: % by Mass)]

The content of monomer units derived from vinyl acetate contained in an ethylene-vinyl acetate copolymer is a value when the total amount of monomer units derived from ethylene and monomer units derived from vinyl acetate is 100% by mass, and measured according to infrared spectroscopy described in JIS K7192.

[Content of Monomer Units Derived from Methyl Methacrylate (Unit: % by Mass)]

The content of monomer units derived from methyl methacrylate contained in an ethylene-methyl methacrylate copolymer was measured by the following method. A 0.3 mm thick press sheet made of an ethylene-methyl methacrylate copolymer was fabricated, and the infrared absorption spectrum was measured. The absorbance of characteristic absorption of a carbonyl group (C=O) emerging around 1700 $cm^{-1}$ of the infrared absorption spectrum was corrected by the thickness of the press sheet, and the amount of a structural unit derived from methyl methacrylate was determined by a calibration curve method.

[Volume Resistivity (Unit: Ω·cm)]

According to JIS K6911, a voltage of 500 V was applied to it for 1 minute at 23° C., the resistance thereof was measured with a digital insulation resistance tester (DSM-8103, manufactured by DKK-TOA Corporation). The volume resistivity was calculated on the basis of the resistance value. The higher the volume resistivity is, the higher the electrical insulation property is.

[Average Light Transmittance (Unit: %)]

The light transmission spectrum along the thickness direction of the sheet was measured with a spectrophotometer (manufactured by Shimadzu Corp., UV-3150), and the average value of the light transmittance within the wavelength range from 400 nm to 1200 nm was calculated.

[Average Particle Diameter (Unit: μm)]

The average particle diameter of silicon dioxide was calculated by the following method.

Silicon dioxide was added into ethanol, and was dispersed with a homogenizer for 10 minutes. The dispersion liquid was irradiated with a laser beam, to obtain a diffraction pattern formed on the focal plane by collecting the scattering light generated with a lense. The resultant diffraction pattern formed on the focal plane was measured as particle size distribution on volume basis by means of a Microtrac particle size analyzer (MT-3000EX II manufactured by Nikkiso Co., Ltd.) and the median particle diameter in cumulative fraction of particle size distribution was determined.

[Melt Flow Rate (MFR, Unit: g/10 min)]

MFR was measured under conditions of a load of 21.18 N and a temperature of 190° C. in accordance with method A specified in JIS K7210-1995.

[Ignition Loss (Unit: %)]

The ignition loss of silicon dioxide was measured in accordance with the method defined in JIS K1150-1994 using a sample dried at about 150° C. for 2 hours under vacuum.

[Degree of Aggregation of Silicon]

The degree of aggregation of silicon was calculated by the following method using an electron probe microanalyzer.

A sample for measurement was fabricated by the following method. A masterbatch was pressed for 5 minutes at a temperature of 110° C. and a pressure of 2 MPa with a hot press machined, then, cooled for 5 minutes at a temperature of 30° C. with a cold press machine, to form a sheet having a thickness of about 500 μm. The sheet was faced by a cryomicrotome at −80° C., to prepare one sample of which the cross-sectional surface along the thickness direction of the sheet was observation plane. The sample was attached to a sample stage for cross-sectional observation with a carbon tape. For conductive treatment, a carbon paste was applied to the lateral side of sample, as non-observation plane and then the sample cross sectional surface as observation plane and the lateral side of the sample as non-observation plane are coated with electron conductive metal (Au). Thereafter, the characteristic X-ray intensity map of the sample observation plate was obtained by using the electron probe microanalyzer (manufactured by Shimadzu Corp., EPMA-1610) at a measurement pitch of 1 μm (image size: 500-500) and an accelerating voltage of 15 kV in a measurement range of 500 μm×500 μm. In this procedure, X-ray spectroscopic conditions were a wavelength of PET/7.126Δ Si-Kα and an exposure time of 10 ms/point. Two characteristic X-ray intensity mapping images with the same size were obtained in each sample. Each intensity mapping image of silicon was gray-scaled using image processing software (Adobe Photoshop®, manufactured by Adobe Systems Incorporated). Using an image analysis software (NanoHunter NS2K-Pro, manufactured by Nanosystem Corporation), the image thresholding was carried out. The image was replaced with white part when the image intensity was 9 or more and 27 or less and the image was replaced with the black part when the intensity was less than 9 is black. In each image after the image thresholding, the white part was defined as a part derived from particles of at least one compound selected from the group consisting of silicon dioxide and zeolite. In each image after the image thresholding, the area-based particle size distribution of an aggregate of the compound was measured. Each value of the degree of aggregation of silicon was determined according to the following formula, and the average value of these values was defined as the degree of aggregation of silicon.

Degree of aggregation of silicon=(the number of particles having an area of over 20 μm² per one particle of the compound)/(the number of particles having an area of over 5 μm² per one particle of the compound)

The silicon dioxide or zeolite used in examples is as follows.

(A-1): Carplex® #67, manufactured by Evonik Degussa Japan Co., Ltd.

non-calcined amorphous silicon dioxide, average particle size: 8 μm, ignition loss: 4.0%

(A-2): Zeolite 820NHA, manufactured by Tosoh Co. Zeolite, average particle size: 5 μm, ignition loss: 4.2%

(A-3): Carplex® CS-5, manufactured by Evonik Degussa Japan Co., Ltd.

calcined amorphous silicon dioxide, average particle size: 8 μm, ignition loss: 1.7%

Example 1

An ethylene-vinyl acetate copolymer (EVA-1, manufactured by Sumitomo Chemical Co., Ltd., KA-30, MFR: 7 g/10 min, the content of monomer units derived from vinyl acetate: 28% by mass) and (A-1) were blended so that the silicon dioxide concentration could be 4% by mass (the total amount of EVA-1 and (A-1) was 100% by mass). The resultant mixture was kneaded by Labo plastomill under conditions of 80° C. and a rotation speed of 25 rpm for 10 minutes. The resultant kneaded substance was pressed with a hot press machine at 100° C. for 5 minutes under a pressure of 2 MPa, then, cooled with a cold press machine at 30° C. for 5 minutes, to form a sheet with a thickness of about 1 mm. The sheet was cut into 5 mm square, to obtain a masterbatch. The degree of aggregation of silicon of the resultant masterbatch is shown in Table 1.

An ethylene-vinyl acetate copolymer (EVA-2, manufactured by Sumitomo Chemical Co., Ltd., KA-40, MFR: 20 g/10 min, the content of a monomer unit derived from vinyl acetate: 28% by mass) and the masterbatch were blended at a proportion of 3% by mass of the masterbatch and 97% by mass of EVA-2 so that the silicon dioxide concentration could be 0.12% by mass (the total amount of EVA-2, EVA-1 and silicon dioxide was 100% by mass). The resultant mixture was granulated by a 30 mmφ granulator at a temperature of 90° C., to obtain pellets. The pellets were pressed at a temperature of 100° C. and a pressure of 2 MPa for 5 minutes with a hot press machine, then, cooled at a temperature of 30° C. for 5 minutes with a cold press machine, to form a sheet having a thickness of about 500 μm. The sheet can be used as a solar battery sealing sheet.

The volume resistivity and the average light transmittance of the resultant solar battery sealing sheet were measured, and the results thereof are shown in Table 1.

Example 2

A sheet was prepared and evaluated in the same matter as in Example 1 excepting that EVA-1 and (A-1) were blended so that the silicon dioxide concentration in the masterbatch could be 20% by mass. The evaluation results are shown in Table 1.

Example 3

A sheet was prepared and evaluated in the same matter as in Example 1 excepting that EVA-1 and (A-1) were blended so that the silicon dioxide concentration in the masterbatch could be 30% by mass. The evaluation results are shown in Table 1.

Example 4

A sheet was prepared and evaluated in the same matter as in Example 1 excepting that EVA-1 and (A-1) were blended so that the silicon dioxide concentration in the masterbatch could be 40% by mass. The evaluation results are shown in Table 1.

Example 5

A sheet was prepared and evaluated in the same matter as in Example 1 excepting that an ethylene-vinyl acetate copolymer (EVA-3, manufactured by Sumitomo Chemical Co., Ltd., K2010, MFR: 3 g/10 min, the content of a monomer unit derived from vinyl acetate: 25% by mass) was used instead of EVA-1 of the ethylene resin contained in the masterbatch. The evaluation results are shown in Table 1.

Example 6

A sheet was prepared and evaluated in the same matter as in Example 1 excepting that an ethylene-methyl methacrylate copolymer (EMMA-1, manufactured by Sumitomo Chemical Co., Ltd., WK307, MFR: 7 g/10 min, the content of a monomer unit derived from methyl methacrylate: 25% by mass) was used instead of EVA-1 of the ethylene resin contained in the masterbatch. The evaluation results are shown in Table 2.

Example 7

A sheet was prepared and evaluated in the same matter as in Example 1 excepting that an ethylene-methyl methacrylate copolymer (E-VA-MMA, manufactured by Sumitomo Chemical Co., Ltd., MFR: 19 g/10 min, the content of a monomer unit derived from vinyl acetate: 15% by mass, the content of a monomer unit derived from methyl methacrylate: 15% by weight, Example 1 of WO2012-165351) was used instead of EVA-1 of the ethylene resin contained in the masterbatch. The evaluation results are shown in Table 2.

Example 8

A sheet was prepared and evaluated in the same matter as in Example 1 excepting that (A-2) was used instead of (A-1). The evaluation results are shown in Table 2.

Example 9

A sheet was prepared and evaluated in the same matter as in Example 8 excepting that EVA-1 and (A-2) were blended so that the silicon dioxide concentration in the masterbatch could be 20% by mass. The evaluation results are shown in Table 2.

Example 10

A sheet was prepared and evaluated in the same matter as in Example 8 excepting that EVA-1 and (A-2) were blended so that the silicon dioxide concentration in the masterbatch could be 30% by mass. The evaluation results are shown in Table 2.

Example 11

An ethylene homopolymer (LDPE-1, manufactured by Sumitomo Chemical Co., Ltd., F200-0, MFR: 2 g/10 min, Density: 924 kg/m$^3$) and (A-1) were blended so that the silicon dioxide concentration was 20% by mass (the total amount of LDPE-1 and (A-1) was 100% by mass). The resultant mixture was kneaded by Labo plastomill under conditions of 80° C. and a rotation speed of 25 rpm for 10 minutes. The resultant kneaded substance was pressed with a hot press machine at 100° C. for 5 minutes under a pressure of 2 MPa, then, cooled with a cold press machine at 30° C. for 5 minutes, to form a sheet with a thickness of about 1 mm. The sheet was cut into 5 mm square, to obtain a masterbatch. The degree of aggregation of silicon of the resultant masterbatch is shown in Table 5.

An ethylene-α-olefin copolymer (LLDPE-1, manufactured by Sumitomo Chemical Co., Ltd., CW2007, MFR: 1.4 g/10 min, Density: 903 kg/m$^3$) and the masterbatch were blended at a proportion of 0.6% by mass of the masterbatch and 99.4% by mass of LLDPE-1 so that the silicon dioxide concentration was 0.12% by mass (the total amount of LDPE-1, LLDPE-1 and silicon dioxide was 100% by mass). The resultant mixture was granulated by a 30 mmφ granulator at a temperature of 90° C., to obtain pellets. The pellets were pressed at a temperature of 100° C. and a pressure of 2 MPa for 5 minutes by a hot press machine, then, cooled at a temperature of 30° C. for 5 minutes by a cold press machine, to form a sheet having a thickness of about 500 μm. The sheet can be used as a solar battery sealing sheet.

The volume resistivity and the average light transmittance of the resultant solar battery sealing sheet were measured, and the results are shown in Table 5.

Example 12

A sheet was prepared and evaluated in the same matter as in Example 11 excepting that LLDPE-1 was used instead of LDPE-1 of the ethylene resin contained in the masterbatch and LLDPE-1 and (A-1) were blended so that the silicon dioxide concentration in the masterbatch could be 4% by mass. The evaluation results are shown in Table 5.

Example 13

A sheet was prepared and evaluated in the same matter as in Example 12 excepting that LLDPE-1 and (A-1) were blended so that the silicon dioxide concentration in the masterbatch could be 20% by mass. The evaluation results are shown in Table 5.

Comparative Example 1

A sheet was prepared and evaluated in the same matter as in Example 1 excepting that the kneading conditions in Labo plastomill were changed to 190° C. and a rotation speed of 25 rpm and the materials were kneaded for 30 minutes in fabrication of the masterbatch. The evaluation results are shown in Table 3.

Comparative Example 2

A sheet was prepared and evaluated in the same matter as in Example 1 excepting that EVA-1 and (A-1) were blended so that the silicon dioxide concentration in the masterbatch could be 2% by mass. The evaluation results are shown in Table 3.

Comparative Example 3

A sheet was prepared and evaluated in the same matter as in Example 1 excepting that EVA-1 and (A-1) were blended so that the silicon dioxide concentration in the masterbatch could be 3% by mass. The evaluation results are shown in Table 3.

Comparative Example 4

A sheet was prepared and evaluated in the same matter as in Example 1 excepting that an ethylene-vinyl acetate copolymer (EVA-4, manufactured by Sumitomo Chemical Co., Ltd., H4011, MFR: 20 g/10 min, the content of a monomer unit derived from vinyl acetate: 20% by mass) was used instead of EVA-1 of the ethylene resin contained in the masterbatch. The evaluation results are shown in Table 3.

Comparative Example 5

A sheet was prepared and evaluated in the same matter as in Example 1 excepting that the masterbatch was not added into EVA-2.

Comparative Example 6

A sheet was prepared and evaluated in the same matter as in Example 1 excepting that (A-3) was used instead of (A-1). The evaluation results are shown in Table 4.

Comparative Example 7

A sheet was prepared and evaluated in the same matter as in Example 6 excepting that EVA-1 and (A-3) were blended so that the silicon dioxide concentration in the masterbatch could be 20% by mass. The evaluation results are shown in Table 4.

Comparative Example 8

A sheet was prepared and evaluated in the same matter as in Example 6 excepting that EVA-1 and (A-3) were blended so that the silicon dioxide concentration in the masterbatch could be 40% by mass. The evaluation results are shown in Table 4.

Comparative Example 9

A sheet was prepared and evaluated in the same matter as in Example 11 excepting that LDPE-1 and (A-1) were blended so that the silicon dioxide concentration in the masterbatch could be 4% by mass. The evaluation results are shown in Table 5.

Comparative Example 10

A sheet was prepared and evaluated in the same matter as in Example 11 excepting that the masterbatch was not added into LLDPE-1.

TABLE 1

| | | Example 1 | Example 2 | Example 3 | Example 4 | Example 5 |
|---|---|---|---|---|---|---|
| ethylene resin contained in masterbatch | | EVA-1 | EVA-1 | EVA-1 | EVA-1 | EVA-3 |
| compound | | (A-1) | (A-1) | (A-1) | (A-1) | (A-1) |
| concentration of compound in masterbatch | % by mass | 4 | 20 | 30 | 40 | 4 |
| degree of aggregation of silicon | — | — | 0.344 | 0.222 | 0.097 | 0.322 | 0.337 |
| base resin of solar battery sealing sheet | | EVA-2 | EVA-2 | EVA-2 | EVA-2 | EVA-2 |
| concentration of compound in solar battery sealing sheet | % by mass | 0.12 | 0.12 | 0.12 | 0.12 | 0.12 |
| volume resistivity of solar battery sealing sheet | $\Omega \cdot cm$ | $6.3 \times 10^{15}$ | $7.6 \times 10^{15}$ | $7.6 \times 10^{15}$ | $5.7 \times 10^{15}$ | $8.1 \times 10^{15}$ |
| average light transmittance of solar battery sealing sheet | % | 92.4 | 92.4 | 92.4 | 92.3 | 92.3 |

TABLE 2

| | | Example 6 | Example 7 | Example 8 | Example 9 | Example 10 |
|---|---|---|---|---|---|---|
| ethylene resin contained in masterbatch | | EMMA-1 | E-VA-MMA | EVA-1 | EVA-1 | EVA-1 |
| compound | | (A-1) | (A-1) | (A-2) | (A-2) | (A-2) |
| concentration of compound in masterbatch | % by mass | 4 | 4 | 4 | 20 | 30 |

TABLE 2-continued

|  |  | Example 6 | Example 7 | Example 8 | Example 9 | Example 10 |
|---|---|---|---|---|---|---|
| degree of aggregation of silicon | — | 0.336 | 0.291 | 0.159 | 0.181 | 0.339 |
| base resin of solar battery sealing sheet |  | EVA-2 | EVA-2 | EVA-2 | EVA-2 | EVA-2 |
| concentration of compound in solar battery sealing sheet | % by mass | 0.12 | 0.12 | 0.12 | 0.12 | 0.12 |
| volume resistivity of solar battery sealing sheet | Ω · cm | $7.6 \times 10^{15}$ | $8.3 \times 10^{15}$ | $5.3 \times 10^{15}$ | $5.8 \times 10^{15}$ | $4.4 \times 10^{15}$ |
| average light transmittance of solar battery sealing sheet | % | 92.3 | 92.3 | 92.3 | 92.2 | 92.2 |

TABLE 3

|  |  | Comparative Example 1 | Comparative Example 2 | Comparative Example 3 | Comparative Example 4 |
|---|---|---|---|---|---|
| ethylene resin contained in masterbatch |  | EVA-1 | EVA-1 | EVA-1 | EVA-4 |
| compound |  | (A-1) | (A-1) | (A-1) | (A-1) |
| concentration of compound in masterbatch | % by mass | 4 | 2 | 3 | 4 |
| degree of aggregation of silicon | — | 0.354 | 0.400 | 0.365 | 0.371 |
| base resin of solar battery sealing sheet |  | EVA-2 | EVA-2 | EVA-2 | EVA-2 |
| concentration of compound in solar battery sealing sheet | % by mass | 0.12 | 0.12 | 0.12 | 0.12 |
| volume resistivity of solar battery sealing sheet | Ω · cm | $3.3 \times 10^{15}$ | $3.4 \times 10^{15}$ | $4.0 \times 10^{15}$ | $4.1 \times 10^{15}$ |
| average light transmittance of solar battery sealing sheet | % | 92.3 | 92.3 | 92.4 | 92.1 |

TABLE 4

|  |  | Comparative Example 5 | Comparative Example 6 | Comparative Example 7 | Comparative Example 8 |
|---|---|---|---|---|---|
| ethylene resin contained in masterbatch |  | — | EVA-1 | EVA-1 | EVA-4 |
| compound |  | — | (A-3) | (A-3) | (A-2) |
| concentration of compound in masterbatch | % by mass | 0 | 4 | 20 | 40 |
| degree of aggregation of silicon | — | — | 0.145 | 0.112 | 0.417 |
| base resin of solar battery sealing sheet |  | EVA-2 | EVA-2 | EVA-2 | EVA-2 |
| concentration of compound in solar battery sealing sheet | % by mass | — | 0.12 | 0.12 | 0.12 |
| volume resistivity of solar battery sealing sheet | Ω · cm | $1.2 \times 10^{15}$ | $3.6 \times 10^{15}$ | $4.0 \times 10^{15}$ | $3.3 \times 10^{5}$ |
| average light transmittance of solar battery sealing sheet | % | 92.3 | 92.3 | 92.3 | 92.2 |

TABLE 5

|  |  | Example 11 | Example 12 | Example 13 | Comparative Example 9 | Comparative Example 10 |
|---|---|---|---|---|---|---|
| ethylene resin contained in masterbatch |  | LDPE-1 | LLDPE-1 | LLDPE-1 | LDPE-1 | LLDPE-1 |
| compound |  | (A-1) | (A-1) | (A-1) | (A-1) | — |
| concentration of compound in masterbatch | % by mass | 20 | 4 | 20 | 4 | — |
| degree of aggregation of silicon | — | 0.268 | 0.277 | 0.179 | 0.411 | — |
| base resin of solar battery sealing sheet |  | LLDPE-1 | LLDPE-1 | LLDPE-1 | LLDPE-1 | LLDPE-1 |

TABLE 5-continued

|  |  | Example 11 | Example 12 | Example 13 | Comparative Example 9 | Comparative Example 10 |
|---|---|---|---|---|---|---|
| concentration of compound in solar battery sealing sheet | % by mass | 0.12 | 0.12 | 0.12 | 0.12 | 0.12 |
| volume resistivity of solar battery sealing sheet | $\Omega \cdot cm$ | $9.5 \times 10^{15}$ | $8.8 \times 10^{16}$ | $1.3 \times 10^{17}$ | $6.7 \times 10^{15}$ | $6.3 \times 10^{15}$ |
| average light transmittance of solar battery sealing sheet | % | 92.3 | 92.3 | 92.3 | 92.2 | 92.2 |

The invention claimed is:

1. A process for producing a solar battery sealing sheet, comprising melt-kneading a mixture of a masterbatch and at least one ethylene resin selected from the group consisting of an ethylene-α-olefin copolymer, an ethylene homopolymer and an ethylene-unsaturated ester copolymer to obtain a melt-kneaded mixture, followed by molding the melt-kneaded mixture into a sheet, wherein the content of the masterbatch is 0.05 to 40 parts by mass with respect to 100 parts by mass of the at least one ethylene resin,
wherein the masterbatch comprises:
at least one ethylene resin selected from the group consisting of an ethylene-α-olefin copolymer, an ethylene homopolymer and an ethylene-unsaturated ester copolymer and
at least one compound selected from the group consisting of silicon dioxide and zeolite,
wherein a degree of aggregation of silicon is 0 or more and 0.350 or less and
the ignition loss of the compound is more than 1.7% to 15% or less; and
the content of the at least one compound selected from the group consisting of silicon dioxide and zeolite in the masterbatch is larger than that in the solar battery sealing sheet.

2. The process for producing a solar battery sealing sheet according to claim 1, wherein the ignition loss of the compound in the masterbatch is 2% or more and 15% or less.

3. The process for producing a solar battery sealing sheet according to claim 1, wherein the ethylene resin in the masterbatch is an ethylene-unsaturated ester copolymer.

4. The process for producing a solar battery sealing sheet according to claim 3, wherein the ethylene-unsaturated ester copolymer in the masterbatch is at least one copolymer selected from the group consisting of an ethylene-vinyl acetate copolymer, an ethylene-methyl acrylate copolymer, an ethylene-methyl methacrylate copolymer and an ethylene-vinyl acetate-methyl methacrylate copolymer.

5. The process for producing a solar battery sealing sheet according to claim 3, wherein the ethylene-unsaturated ester copolymer in the masterbatch is an ethylene-unsaturated ester copolymer containing a monomer unit derived from an unsaturated ester in an amount of 23% by mass or more and 35% by mass or less, with respect to a total amount of a monomer unit derived ethylene and a monomer unit derived from the unsaturated ester of 100% by mass.

6. The process for producing a solar battery sealing sheet according to claim 4, wherein the ethylene-unsaturated ester copolymer in the masterbatch is an ethylene-unsaturated ester copolymer containing a monomer unit derived from an unsaturated ester in an amount of 23% by mass or more and 35% by mass or less, with respect to a total amount of a monomer unit derived ethylene and a monomer unit derived from the unsaturated ester of 100% by mass.

7. The process for producing a solar battery sealing sheet according to claim 2, wherein the ethylene resin in the masterbatch is an ethylene-unsaturated ester copolymer.

8. The process for producing a solar battery sealing sheet according to claim 7, wherein the ethylene-unsaturated ester copolymer in the masterbatch is at least one copolymer selected from the group consisting of an ethylene-vinyl acetate copolymer, an ethylene-methyl acrylate copolymer, an ethylene-methyl methacrylate copolymer and an ethylene-vinyl acetate-methyl methacrylate copolymer.

9. The process for producing a solar battery sealing sheet according to claim 7, wherein the ethylene-unsaturated ester copolymer in the masterbatch is an ethylene-unsaturated ester copolymer containing a monomer unit derived from an unsaturated ester in an amount of 23% by mass or more and 35% by mass or less, with respect to a total amount of a monomer unit derived ethylene and a monomer unit derived from the unsaturated ester of 100% by mass.

10. The process for producing a solar battery sealing sheet according to claim 8, wherein the ethylene-unsaturated ester copolymer in the masterbatch is an ethylene-unsaturated ester copolymer containing a monomer unit derived from an unsaturated ester in an amount of 23% by mass or more and 35% by mass or less, with respect to a total amount of a monomer unit derived ethylene and a monomer unit derived from the unsaturated ester of 100% by mass.

* * * * *